(12) United States Patent
Hoffman

(10) Patent No.: US 7,943,006 B2
(45) Date of Patent: May 17, 2011

(54) METHOD AND APPARATUS FOR PREVENTING ARCING AT PORTS EXPOSED TO A PLASMA IN PLASMA PROCESSING CHAMBERS

(75) Inventor: Daniel John Hoffman, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1037 days.

(21) Appl. No.: 11/610,709

(22) Filed: Dec. 14, 2006

(65) Prior Publication Data

US 2008/0141940 A1 Jun. 19, 2008

(51) Int. Cl.
*C23C 16/513* (2006.01)
*C23C 16/00* (2006.01)
*H01L 21/306* (2006.01)
*H03H 7/46* (2006.01)

(52) U.S. Cl. ............... 156/345.31; 118/719; 118/723 R; 118/733; 333/32; 156/345.28

(58) Field of Classification Search .................. 156/914, 156/345.28; 118/733
See application file for complete search history.

(56) References Cited

U.S. PATENT DOCUMENTS

| | | | |
|---|---|---|---|
| 6,564,818 B2 * | 5/2003 | Kroeker et al. | 137/15.23 |
| 2004/0050327 A1 * | 3/2004 | Johnson et al. | 118/715 |
| 2004/0149216 A1 * | 8/2004 | Osada et al. | 118/723 E |

* cited by examiner

*Primary Examiner* — Karla Moore
*Assistant Examiner* — Nathan K Ford
(74) *Attorney, Agent, or Firm* — Patterson & Sheridan, LLP

(57) ABSTRACT

A method and apparatus for preventing arcing at a port exposed to a plasma in a plasma chamber use circuit components causing a door sealing the port to provide a short circuit path at excitation frequency of the plasma. In one embodiment, the door is a slit valve door sealing a substrate transfer port of an etch chamber.

9 Claims, 6 Drawing Sheets

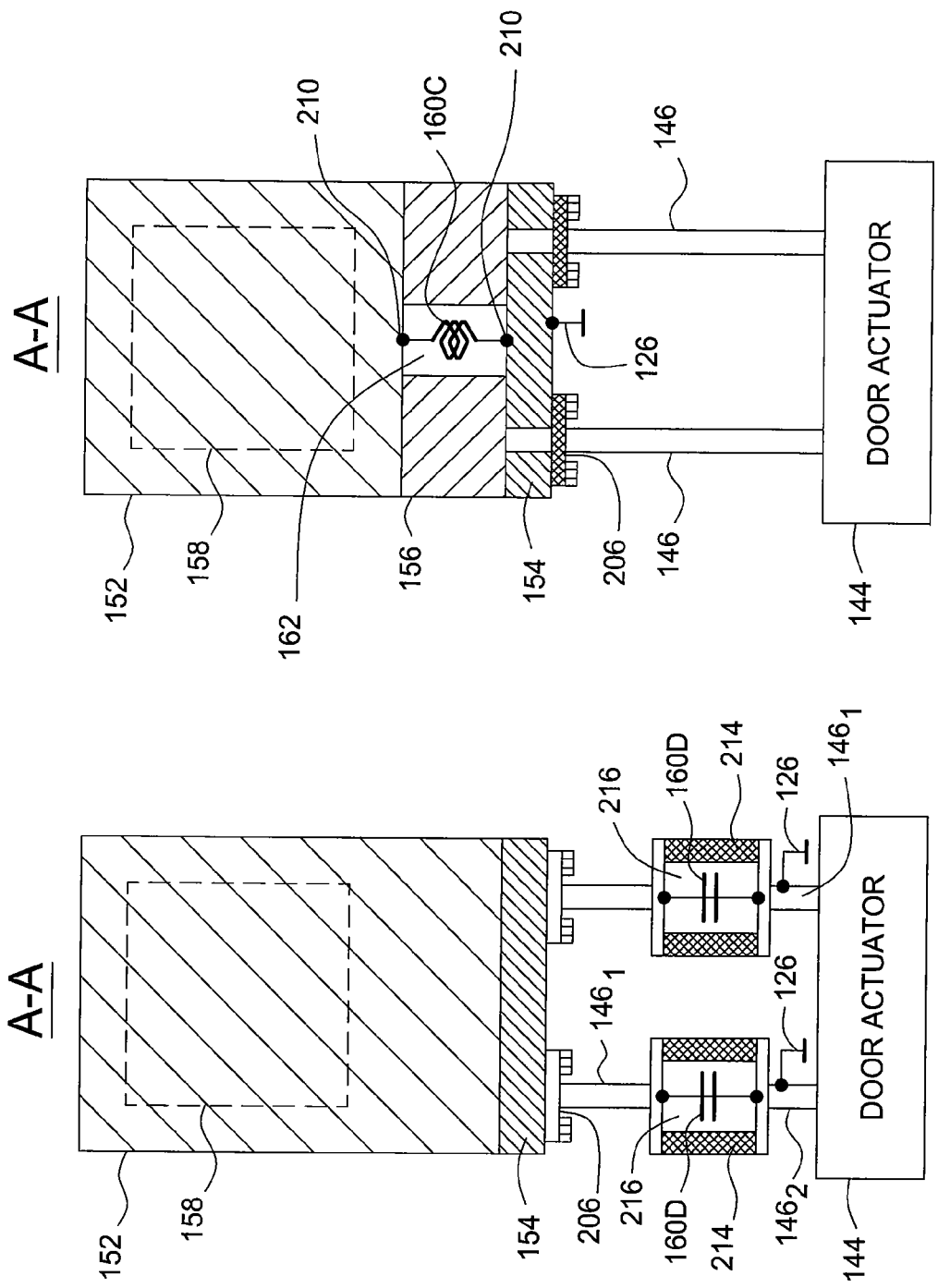

METHOD AND APPARATUS FOR PREVENTING ARCING AT PORTS EXPOSED TO A PLASMA IN PLASMA PROCESSING CHAMBERS

BACKGROUND OF THE INVENTION

1. Field of the Invention

Embodiments of the present invention generally relate to plasma processing chambers used in the semiconductor industry to manufacture integrated circuits and, more specifically, to methods and apparatuses for preventing arcing or undesired plasma glows in plasma processing chambers.

2. Description of the Related Art

In the manufacture of integrated circuits (ICs), many processing steps are performed using plasma chambers, such as plasma etch chambers, plasma enhanced chemical vapor deposition (PECVD) chambers, reactive ion etch (RIE) chambers, electron cyclotron resonance (ECR) chambers, and the like. Plasma-induced arcing in such chambers is a phenomenon that detrimentally affects yield and, specifically, causes particle contamination and uniformity of the fabricated features and devices of the ICs.

One particular region vulnerable to plasma-induced arcing or plasma glows is the region adjacent to slit valve doors utilized to seal substrate transfer ports. In particular, plasma arcing is often observed in proximity to substrate transfer ports and, specifically, at doors used for sealing such ports during plasma processing of substrates in the respective chambers. Generally, severity of plasma arcing in these regions increases with excitation frequency of the plasma.

Unless the plasma is surrounded by surfaces representing a short circuit at excitation frequency of the plasma, arcing may occur between the plasma and those inner surfaces of a processing chamber. While many components of the processing chamber can be sufficiently well grounded using, for example, multi-point grounding techniques, preventing plasma formation at or near the slit valve door has remained a challenge.

Therefore, there is a need for improvements in the prevention of undesired plasma formation at chamber ports.

SUMMARY OF THE INVENTION

A method and apparatus for preventing arcing at a port exposed to a plasma in a plasma processing chamber are provided. In one particular embodiment, the port is a substrate transfer port of the chamber.

One aspect of the present invention is a method for fabricating a door of a slit valve. In one embodiment, the method includes fabricating a door which panels are electrically coupled together using one or more circuit components that cause the door to provide, at excitation frequency of a plasma, a short circuit. In another embodiment, the circuit components are disposed in elements of an actuator of the door.

Another aspect of the present invention is a slit valve door fabricated using the inventive method. The door may be used in a plasma chamber to suppress plasma-induced arcing in proximity to substrate transfer ports and the door itself.

Yet another aspect of the present invention is a plasma processing chamber for fabricating integrated circuits on substrates. The processing includes a substrate transfer port that, during plasma processing, is selectively sealed using the inventive door assembly.

In still another embodiment, a processing chamber is provided that has a component that is coupled to ground through a circuit having an inductance selected to influence the shape and/or position of a plasma within the processing chamber. In one embodiment, the component may be a slit valve door. As such, the plasma may be influenced by the door to correct or reposition the plasma in relation to a substrate support, thus compensating for other electrical or conductive (pumping) asymmetries of the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2E are cross-sectional views of exemplary embodiments of the slit valve door of FIG. 1;

Figure 1:
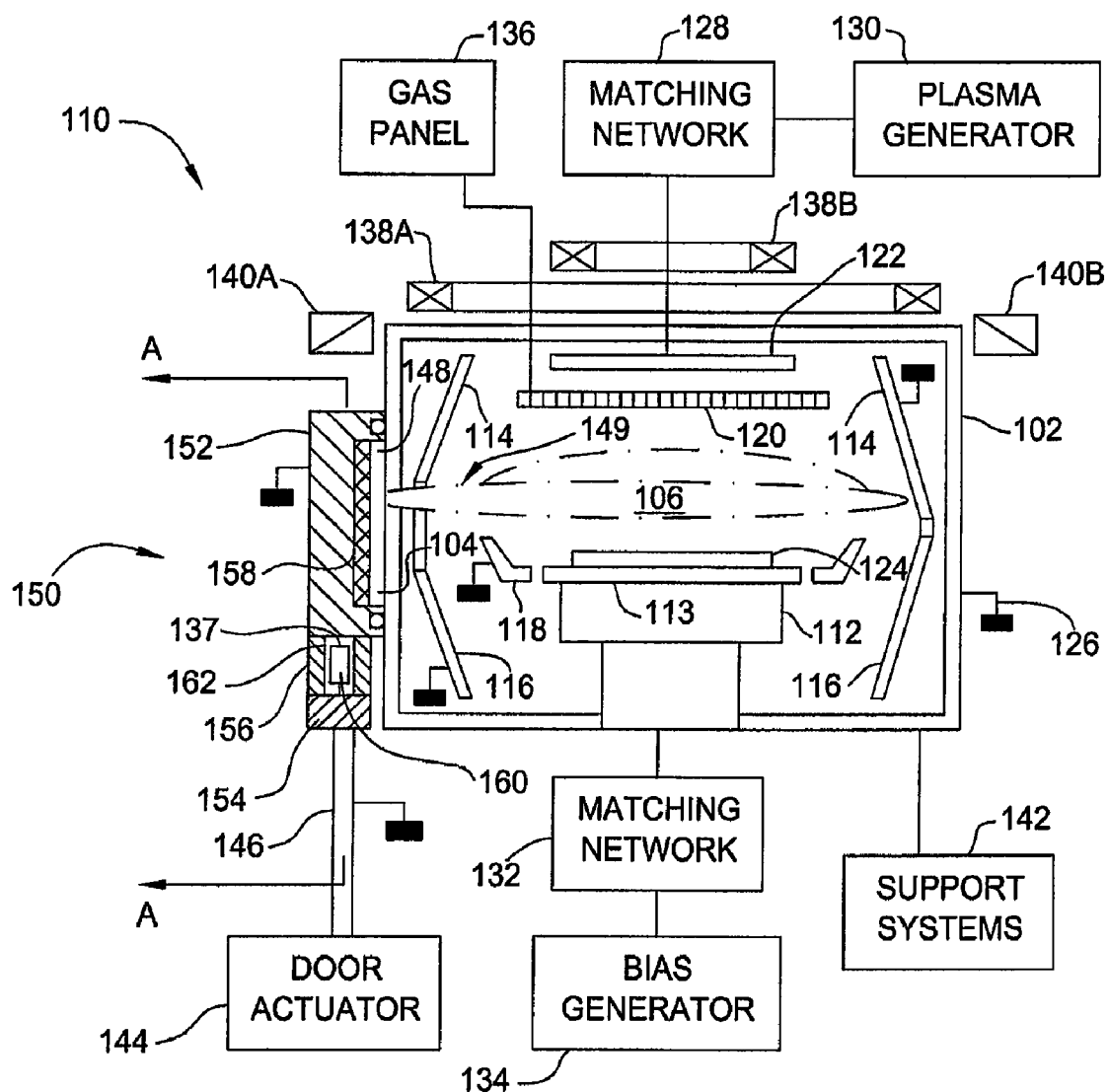
FIG. 1 is a high-level, schematic diagram of a plasma chamber including a processing chamber having a slit valve door in accordance with one embodiment of the present invention.

To facilitate understanding, identical reference numerals have been used, where possible, to designate identical elements that are common to the figures, except that suffixes may be added, when appropriate, to differentiate such elements. The images in the drawings are simplified for illustrative purposes and are not depicted to scale. It is contemplated that features or steps of one embodiment may be beneficially incorporated in other embodiments without further recitation.

DETAILED DESCRIPTION

FIG. 1 is a high-level, schematic diagram of a plasma reactor 100 including a processing chamber 110 having a slit valve door 150 in accordance with one embodiment of the present invention. In the depicted embodiment, the plasma processing chamber 110 illustratively comprises a chamber body 102, a substrate pedestal 112 having an electrostatic chuck 113, liners 114, 116, a plasma-confining buffer 118, a showerhead 120 fluidly coupled to a gas panel 136, an upper electrode 122, and the slit valve door 150.

FIGS. 2A-2E provide sectional views of exemplary embodiments of the slit valve door 150 of FIG. 1. To best understand the invention, the reader should simultaneously refer to FIGS. 1 and 2A-2E.

The chamber body 102 is formed from a conductive material (for example, aluminum (Al)) and contains a substrate transfer port 104 for the entry and egress of substrates 124 processed in the reactor 100 (one substrate 124 disposed on the substrate chuck 113 is shown). Conventionally, the chamber body 102, liners 114, 116, buffer 118, and, optionally, the showerhead 120 are coupled to a ground terminal 126 of the reactor 100. In particular, the liners 114, 116, buffer 118, and showerhead 120 may be grounded using a multi-point grounding technique.

The upper electrode 122, through a matching network 128, is connected to a plasma power generator 130. The substrate pedestal 112, through a matching network 132, is connected to a bias power generator 134. In one exemplary embodiment, the plasma power generator 130 and the bias power generator 134 are radio-frequency (RF) power supplies having operating frequencies of about 162 MHz and 13.56 MHz, respectively.

During processing a substrate 124, the plasma power generator 130 and the bias power generator 134, together or individually, produce plasma 106 (shown in phantom). In the depicted embodiment, the plasma 106 may be further controlled using optional steering coils and magnets (or electromagnets) (steering coils 138A, 138B and magnets 140A, 140B are shown). The processing reactor 100 also includes conventional systems and devices, which, in operation, facilitate execution and control of plasma processing of the substrates 124 in the reactor 100. Such systems are collectively shown herein as support systems 142.

The reactor 100 may be an etch chamber employing a plasma for etching material used in fabrication of various integrated circuits. One suitable etch reactor that may be adapted to benefit from the invention is an ENABLER® plasma etch reactor available from Applied Materials, Inc., located in Santa Clara, Calif. In other embodiments, the processing chamber 110 may have the plasma or bias generators operating at different frequencies, as well as having different means for producing the plasma, and adapted for performing plasma enhanced chemical vapor deposition or physical vapor deposition processes, among other plasma processes. In one embodiment, the processing chamber 110 may have one or more external, internal, or remote inductive or capacitive RF plasma source or a microwave (MW) plasma source. Various types of the plasma chambers that may benefit from the invention are commercially available from Applied Materials Inc., among other plasma processing equipment manufacturers.

The slit valve door 150 provides a barrier between the interior of the chamber 110 and neighboring chambers that may be opened to allow substrate transfer. In operation, a door actuator 144, via at least one driving rod 146, moves the slit valve door 150 between open and closed positions. During plasma processing in the processing chamber 110, the slit valve door 150 is positioned in an upper, or closed, position (shown in FIG. 1), where the door may provide a vacuum-tight seal of the substrate transfer port 104. Accordingly, when the slit valve door 150 is positioned in a lower, or open, position (not shown), the substrate 124 may be transferred through the substrate transfer port 104 into or out of the processing chamber 110 through a port 149 formed between or in one of the liners 114, 116.

The slit valve door 150 may be spaced apart from adjacent portions of the door and the chamber body 102 defining gaps 148. During a plasma process, the plasma may extend through the port 149 of the liners 114, 116, and further through the substrate transfer port 104, to the slit valve door 150 and, sometimes, into the gaps 148.

In one embodiment, the slit valve door 150 includes a sealing panel 152, a driving panel 154, and a spacer 156. The spacer 156 is disposed between the panels 152, 154. In the sealed position, the sealing panel 152 closes the substrate transfer port 104. In this position, the sealing panel 152 may be exposed to the plasma 106.

Each of the panels 152, 154 is fabricated from a conductive material (for example, aluminum, stainless steel or other suitable metal), while the spacer 156 is fabricated from a dielectric material, such as a plastic, ceramic, polyimide, or other suitable dielectric material. In one embodiment, the sealing panel 152 has a protective layer 158 (for example, silicon carbide (SiC) layer) that, in the sealed position, faces the interior of the processing chamber 110 through the substrate transfer port 104.

The driving panel 154 is mechanically connected to one or more driving rods 146 of the door actuator 144. In some embodiments, the driving rods 146 are fabricated from a conductive material (for example, metal or alloy) and electrically coupled to the driving panel 154 and the ground terminal 126 of the reactor 100, as shown in FIGS. 2A-2C, through a circuit component 160A, 160B or 160C.

In an alternate embodiment shown in FIG. 2D, the driving rods 146 may be fabricated from a dielectric material (as shown) or be electrically isolated from the driving panel 154 (not shown in FIG. 2D). In this embodiment, the sealing panel 152 is electrically coupled via the driving panel 154 to the ground terminal 126 through a separate electrical lead.

Figure 2A:
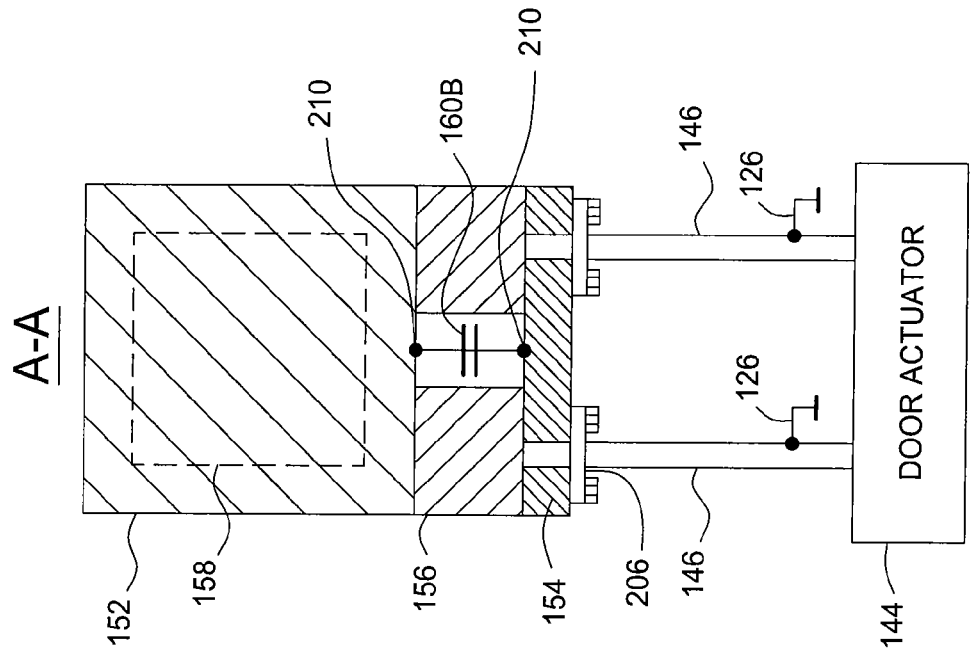
Figure 2B:
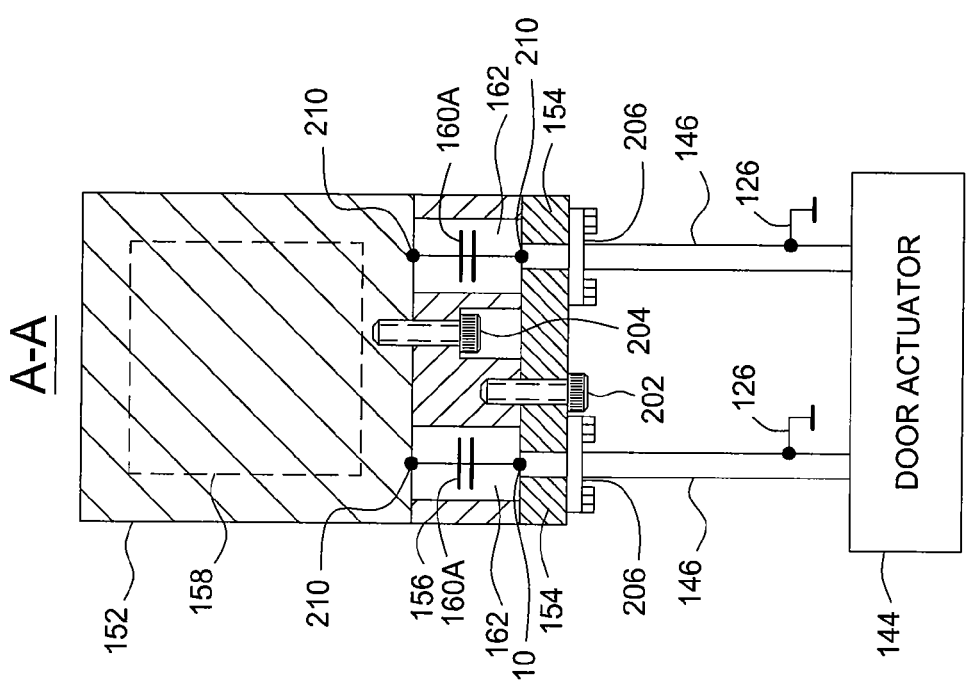
Figure 2E:
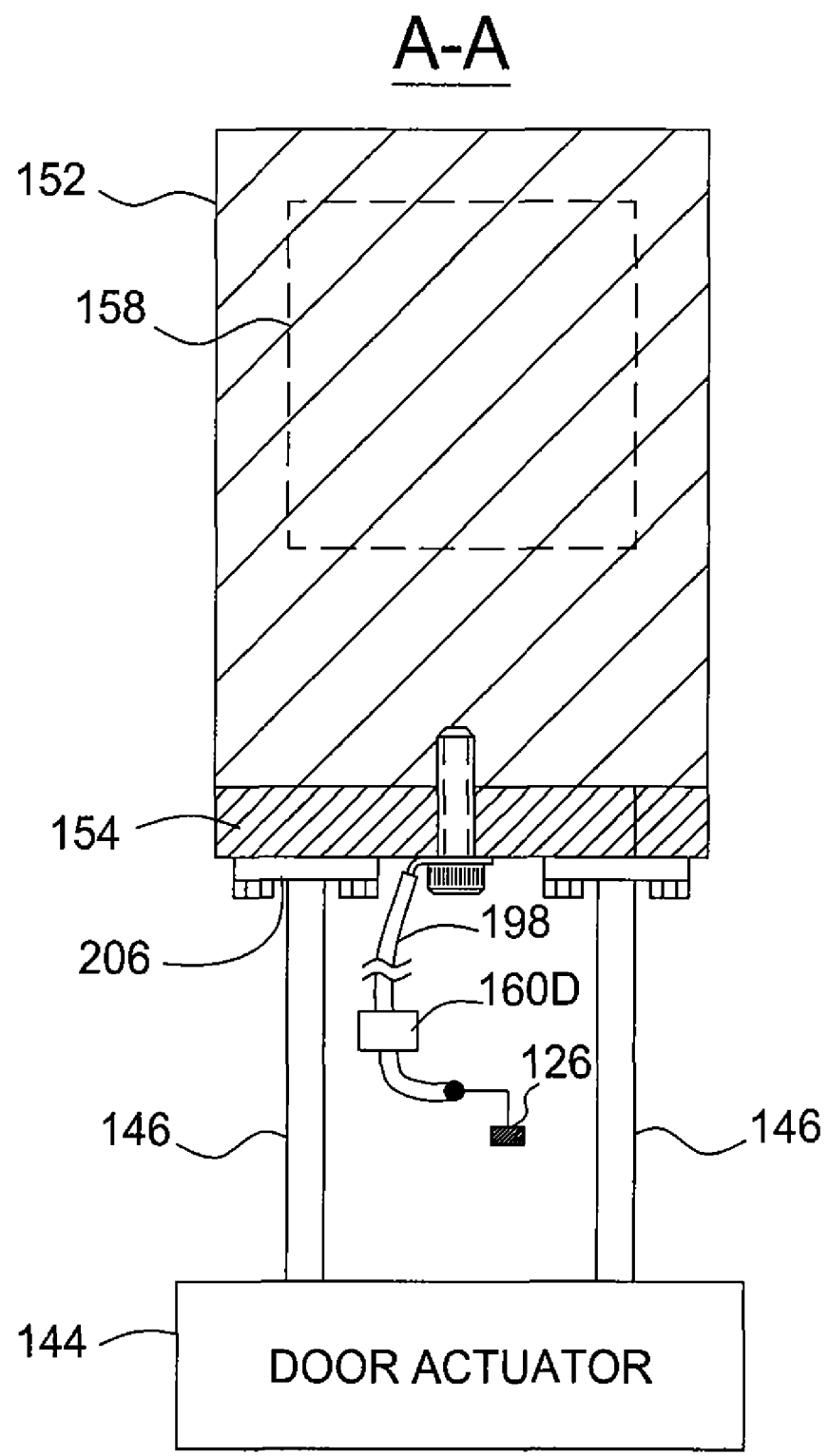

In another alternate embodiment shown in FIG. 2E, a circuit component 160D may be disposed between the door 150 and ground 126 in a suitable location remote from the door 150, as shown in FIG. 2E. In this embodiment, the sealing panel 152 is electrically coupled to the ground terminal 126 through a separate electrical lead 198 having the circuit component 160D in series.

Referring to FIGS. 2A-2D, illustratively, the panels 152, 154 and the spacer 156 are mechanically coupled using fasteners 202, 204 (for example, screws, rivets, clamps or other coupling element). In the embodiments depicted in FIGS. 2A-C, the fasteners 202, 204 (shown only in FIG. 2A for clarity) are arranged to prevent electrical coupled between the panels 152, 154 through the fasteners 202, 204. The driving rods 146 may be connected to the driving panel 154 using conductive flanges 206 (as shown in FIGS. 2A-2B, 2D) or non-conductive flanges 208 (as shown in FIG. 2C).

In the embodiments depicted in FIGS. 2A-C, the panels 152, 154 are electrically coupled together using one or more circuit components. The circuit components are depicts as 160A in the embodiment of FIG. 2A, 160B in the embodiment of FIG. 2B, and 160C in the embodiment of FIG. 2C. The circuit components, now collectively referred to as components 160, are selected such that the ground path through the door 150 has a pre-determined impedance matching the excitation frequency $F_{PL}$ of the plasma 106. It is also contemplated that the components 160 may be alternatively selected such that the ground path through the door 150 has a pre-determined impedance offset from the excitation frequency $F_{PL}$ of the plasma 106 so that the potential difference influences the shape, position or other plasma characteristic, for example, to correct or create plasma asymmetries cause by other chamber or reactor components. In one example, the frequency $F_{PL}$ is an operating frequency of about 162 MHz of the plasma generator 130. In embodiments shown in FIGS. 1, 2A-2C, the circuit components 160 are disposed in cavities 162 formed in the spacers 156. The cavities 162 are configured with terminals (not shown) to facility easy replacement and exchange of the circuit components 160.

In an alternative embodiment depicted in FIG. 2D, the slit valve door 150 includes the sealing panel 152 and, optionally, the driving panel 154. Each of the driving rods 146 includes portions $146_1$ and $146_2$, which are separated using a dielectric spacer 214. In this embodiment, the circuit component 160D are disposed in cavities 216 formed in the spacers 214.

Referring collectively to the embodiments depicted in FIGS. 2A-D, contact leads of the circuit components 160 may be connected to the respective elements of the slit valve door 150 or driving rods 146 using solder, binding or moveable contacts 210. Examples of contacts 210 include bayonet fittings, solder terminals, buses and the like. Together with the circuit components 160, the sealing panel 152, driving panel 154 and driving rods 146 provide a short circuit (i.e., form a short-circuit path) at the excitation frequency $F_{PL}$ of the plasma, thereby suppressing plasma-induced arcing at the driving panel 154, substrate transfer port 104, and in the gaps 148. In particular, values of the circuit components 160 are selectively chosen to form the short circuit at the excitation frequency $F_{PL}$. In embodiments wherein more than one plasma excitation frequency is utilized, each circuit component may be selected to provide a short circuit at a respective frequency.

Figure 3A:
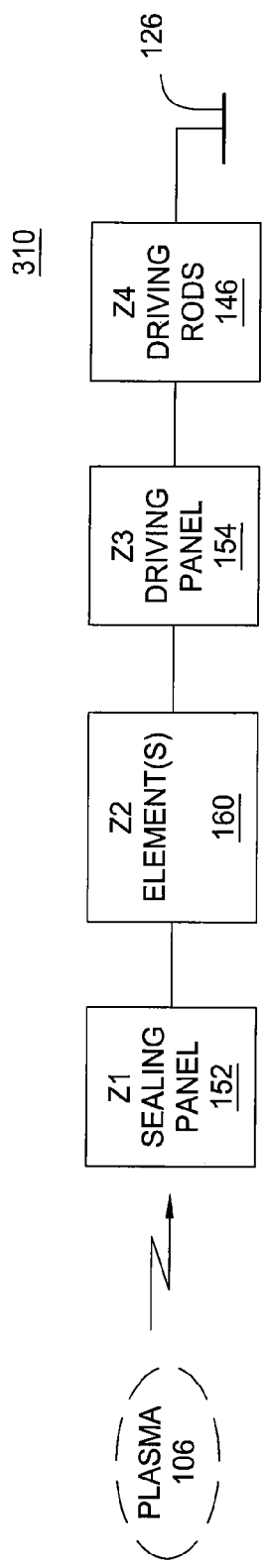
FIGS. 3A-3C are equivalent electrical circuits of the slit valve doors depicted in FIGS. 2A-2E.
Figure 3B:
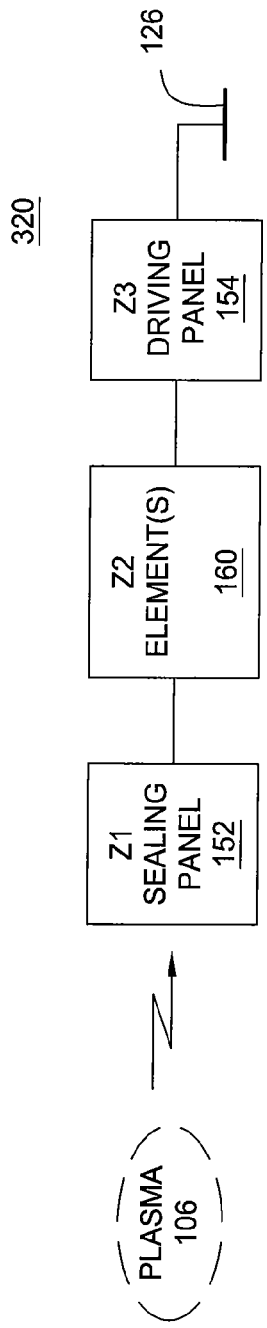
Figure 3C:
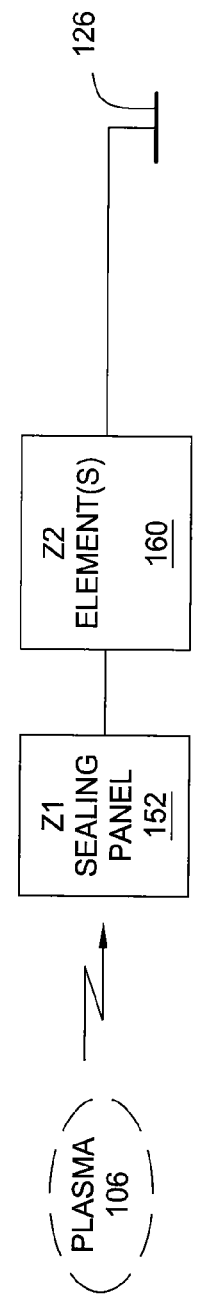

FIGS. 3A-3C depict equivalent electrical circuits 310, 320, 330 of the slit valve door 150 fabricated in accordance with embodiments of the present invention shown in FIGS. 2A-2E. Referring to FIG. 3A and FIGS. 2A-2C, during plasma processing, the sealing panel 152 and conductive driving rods 146 represent to the plasma 106 capacitive and inductive impedances Z1 and Z4, respectively, while impedance Z3 of the driving panel 154 is about 0 (zero). In the embodiments of FIGS. 2A-2C, the slit valve door 150 forms a short circuit at the excitation frequency $F_{PL}$ when components 160A (shown in FIG. 2A) or a single component 160B, 160C (shown in FIGS. 2B-2C) are capacitors, which impedances are selected such that, at the frequency $F_{PL}$, impedance $Z_{310}$ of an equivalent electrical circuit 310 is equal to or about zero, i.e., $$Z_{310}=Z1+Z2+Z3+Z4\approx 0. \quad (1)$$

Referring to FIG. 3B and FIG. 2D, during plasma processing, the sealing panel 152 represents capacitive impedance Z1 to the plasma 106, while Impedance Z3 of the driving panel 154 is about zero. The slit valve door 150 forms a short circuit at the excitation frequency $F_{PL}$ when circuit components 160D is an capacitor, which capacitance is selected such that, at the frequency $F_{PL}$, impedance $Z_{320}$ of an equivalent electrical circuit 320 is equal to or about zero, i.e., $$Z_{320}=Z1+Z2+Z3\approx 0. \quad (2)$$

Referring to FIG. 3C and FIG. 2E, during plasma processing, the sealing panel 152 represents capacitive impedance Z1 to the plasma 106. The slit valve door 150 forms a short circuit at the excitation frequency $F_{PL}$ when circuit components 160E is an capacitor, which capacitance is selected such that, at the frequency $F_{PL}$, impedance $Z_{330}$ of an equivalent electrical circuit 330 is equal to or about zero, i.e., $$Z_{330}=Z1+Z2\approx 0. \quad (3)$$

Values of the capacitors of the circuit components 160A-160E may be determined by measuring impedance of the respective slit valve doors 150 where the circuit components 160 are temporarily replaced with shunts. Such measurements can be performed using, for example, a network analyzer which probe is coupled, through the substrate transfer port 104, to the sealing panel 152. The results of these measurements allow to define properties S1=Z1+Z3+Z4 and S2=Z1+Z3 in the equations (1) and (2), respectively. Then, values of the capacitors 160A-160C may be determined by resolving the equation:

$$S1+Z2=0, \quad (4)$$

It is contemplated that the circuit components 160A-160E may include inductor and/or other circuit components.

Alternatively, during plasma processing of non-product substrates, values of the circuit components 160 may be determined experimentally, e.g., by selecting the components that provide suppression of the plasma-induced arcing at the slit valve door 150 or the substrate transfer port 104. Once the appropriate value of the capacitor or other circuit component 160 is determined, the door 150 (or rod) may be disassembled and a capacitor of the determined value may be installed in the cavity or other position along the door to ground path.

Figure 4:
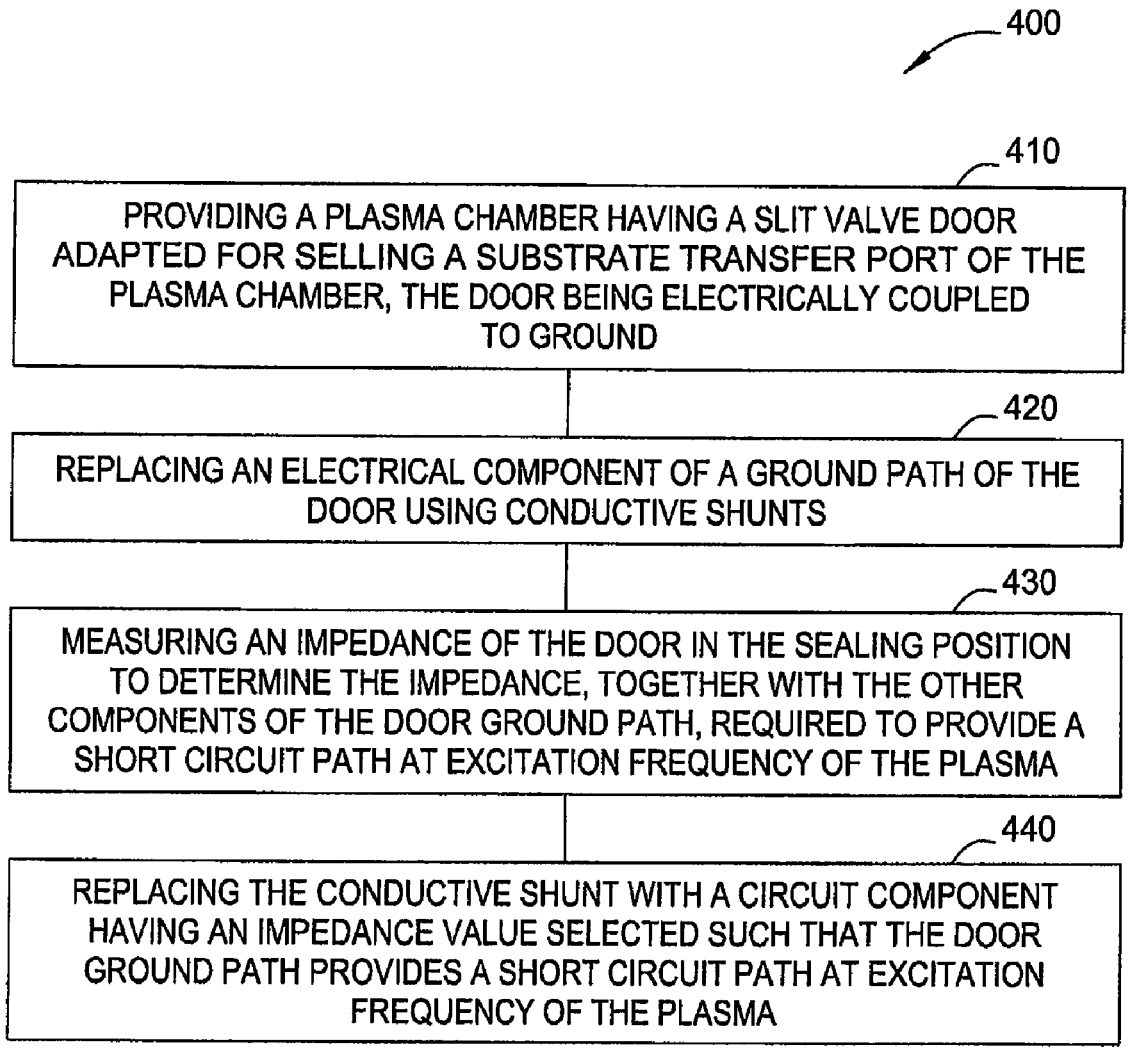
FIG. 4 is a flow diagram illustrating a method for preventing arcing in a plasma chamber at a port exposed to plasma in accordance with one embodiment of the present invention.

FIG. 4 is a flow diagram illustrating a method 400 for preventing arcing in a plasma chamber at a port exposed to plasma in accordance with one embodiment of the present invention. One skilled in the art will readily appreciate that the method 400 may be performed using the plasma etch reactor 100 of FIG. 1, among other chambers adapted for performing plasma processes. One skilled in the art will also readily appreciate that the method 400 may be performed to tune other components of an plasma processing system to prevent arcing, or to reposition the plasma within the chamber to correct or create plasma asymmetry.

The method 400 begins at step 410 when the plasma chamber is provided with a slit valve door adapted for sealing a substrate transfer port of the plasma chamber. The door is electrically coupled to ground. The door ground path includes at least one replaceable electrical component, such as a capacitor and/or inductor. It is also contemplated that the door ground path may alternatively include a tunable electrical component, wherein tunable component allows the impedance of the ground path to be adjusted. Examples of such doors are discussed above in reference to FIGS. 1 and 2A-2E.

At step 420, the electrical component of the ground path of the door is temporarily replace using conductive shunts. Then, at step 430, impedance of the door in the sealing position is measured to determine the impedance, together with the other components of the door ground path, required to provide a short circuit path at excitation frequency of the plasma. The impedance may be determined a network analyzer or experimentally, e.g., by literately choosing circuit components, such as capacitors and/or inductors, that suppress arcing at the door or substrate access port or create the desired plasma configuration.

At step 440, the conductive shunt is replaced with a circuit component having an impedance value selected such that the door ground path provides a short circuit path at excitation frequency of the plasma. During plasma processing, the door suppresses plasma-induced arcing in proximity to the port exposed to the plasma. Upon completion of step 440, the method 400 ends. It is contemplated that the method 400 may be adapted to determine a door ground path impedance for use in tuning other components of the plasma processing chamber to prevent arcing, or to reposition the plasma within the chamber to correct or create plasma asymmetry.

Thus, a method and apparatus has been provided controls plasma positing in a plasma processing chamber. Advantageously, the invention may be utilized to prevent arcing at substrate transfer ports or other components exposed to a plasma in the processing chamber, as well as to tune other components of the plasma processing chamber to prevent arcing, or to reposition the plasma within the chamber to correct or create plasma asymmetry.

Although the invention herein has been described with reference to particular exemplary embodiments, it is to be understood that these embodiments are merely illustrative of the principles and applications of the present invention. Therefore, numerous modifications may be made to these embodiments and other arrangements may be devised without departing from the spirit and scope of the present invention, and the scope thereof is defined by the appended claims.

What is claimed is:
1. A plasma processing chamber, comprising:
a chamber body having a substrate access port;

a door positionable to close the substrate access port, the door having a face exposed to a region within the chamber body in which a plasma is formed, wherein the door comprises:
  a sealing panel positionable to close the access port;
  a driving panel coupled to the sealing panel; and
  a dielectric spacer electrically isolating the driving panel from the sealing panel; and
a ground path coupling the door to ground, the ground path comprising at least one of a tunable or replaceable circuit component selected in response to an excitation frequency of the plasma and providing a predefined impedance value between the door and ground, the circuit component being at least one of a capacitor or inductor, wherein the spacer houses the circuit component, and wherein the circuit component electrically couples the driving panel to the sealing panel.

2. The processing chamber of claim 1, wherein the circuit component is disposed in the door.

3. The processing chamber of claim 1, wherein the driving panel is coupled to ground.

4. The processing chamber of claim 1, wherein the circuit component is remote from the door.

5. The processing chamber of claim 4 further comprising:
  an actuator; and
  a rod coupling the actuator to the door, wherein the circuit component is coupled in series with the rod.

6. The processing chamber of claim 4, wherein the rod is coupled to ground.

7. The processing chamber of claim 4, wherein the rod further comprises:
  a cavity having the circuit component disposed therein.

8. The processing chamber of claim 4 further comprising:
  a lead coupled to the door, the lead having the circuit component coupled in series.

9. The processing chamber of claim 1, further comprising:
  a rod;
  an actuator coupled to the door by the rod, the actuator controlling the position of the door; and
  wherein the ground path comprises the replaceable circuit component disposed in at least one of the rod or door.

* * * * *